United States Patent

Shi et al.

[11] Patent Number: 5,985,417
[45] Date of Patent: Nov. 16, 1999

[54] POLYMER STABILIZED MOLECULAR WHOLE TRANSPORTING MATERIALS FOR ORGANIC ELECTROLUMINESCENCE DISPLAYS

[75] Inventors: Song Shi, Phoenix; Franky So, Tempe, both of Ariz.; H. C. Lee, Calabasas, Calif.

[73] Assignee: Motorola, Inc., Schaumburg, Ill.

[21] Appl. No.: 08/706,898

[22] Filed: Sep. 3, 1996

[51] Int. Cl.⁶ .................................................. B32B 9/00
[52] U.S. Cl. ...................... 428/195; 428/690; 524/255; 524/256
[58] Field of Search ................... 428/195, 690; 524/255, 256

[56] References Cited

U.S. PATENT DOCUMENTS

| | | |
|---|---|---|
| 3,282,889 | 11/1966 | Tomlinson ........................... 524/256 |
| 4,539,507 | 9/1985 | VanSlyke et al. ..................... 313/504 |
| 5,256,945 | 10/1993 | Imai et al. ........................... 313/504 |
| 5,281,489 | 1/1994 | Mori ................................... 428/690 |
| 5,319,010 | 6/1994 | Mitani ................................. 524/255 |
| 5,378,519 | 1/1995 | Kikuchi ............................... 428/690 |
| 5,409,783 | 4/1995 | Tang ................................... 428/690 |
| 5,443,921 | 8/1995 | Hosokawa et al. .................... 428/690 |
| 5,518,824 | 5/1996 | Funhoff, et al. ...................... 428/690 |
| 5,554,450 | 9/1996 | Shi ..................................... 428/690 |
| 5,639,581 | 6/1997 | Iwaskai ............................... 430/59 |
| 5,645,965 | 7/1997 | Duff ................................... 430/59 |

*Primary Examiner*—Paul R. Michl
*Attorney, Agent, or Firm*—Eugene A. Parsons

[57] ABSTRACT

An organic electroluminescent display device (10) includes a plurality of organic layers (16, 18, 20, 22 and 24) disposed between opposing electrodes (14 and 26). The hole transporting layer (22) is composed of a hole transporting material stabilized by a polymeric network.

12 Claims, 1 Drawing Sheet

POLYMER STABILIZED MOLECULAR WHOLE TRANSPORTING MATERIALS FOR ORGANIC ELECTROLUMINESCENCE DISPLAYS

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphorus surface of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each are accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. Charge carriers specifically, electrons and holes, are generated in the electron and hole transporting region. Electrons are negatively charged atomic particles and holes are the positively charged counterparts. The charge carriers are injected into the emissive layer, where they combine, emitting light.

OED's are attractive owing to low driving voltage, i.e., less than about 20 volts. Hence, they have a potential application to full color flat emissive displays. OED's have heretofore suffered from relatively short usage lifetimes. Though significant lifetime for OED's has been achieved as in, for example, U.S. Pat. No. 4,720,432 to VanSlyke, et al, further improvement is needed, particularly in applications where high brightness is required. In general, the hole transporting materials used in the hole transporting layer of an OED are the most vulnerable parts, and hence, contribute significantly to shortened lifetime for devices. The hole transporting layers are typically susceptible to thermal degradation by physical aggregation or recrystallization.

To address the thermal degradation problems associated with hole transporting materials in OED's, hole transporting materials characterized by high glass transition temperatures, and bonded onto a polymer have been proposed. These are shown in, for example, U.S. Pat. No. 5,061,569 and 5,443,921. While the thermal degradation problem has been somewhat alleviated by the solution proposed in the aforementioned patents, they have nonetheless continued to plague the hole transporting materials used in OED's.

Another approach described in U.S. Pat. No. 5,518,824 to Funhoff, et al, discloses an electroluminescent arrangement containing one or more organic layers, at least one of the layers being obtained by thermal or radiation induced crosslinking, and where at least one charge transporting compound is present per layer. While the '824 patent appears to have achieved some improvement in thermal degradation, it has come at the cost of high operating voltage. Specifically, operating voltage of the device disclosed in the '824 patent is on the order of 93 volts, far too high for practical use in portable applications.

Accordingly, there exists a need for improved materials for use as the hole transporting layer in OED's. The material should be relatively inexpensive and easy to fabricate as well as being conducive to manufacturing in the current OED manufacturing process. The device should have good thermal stability, and be capable of operating at voltages which are within the range of those generally accepted for OED's.

DETAILED DESCRIPTION OF THE PREFERRED EMBODIMENT

Figure 1:
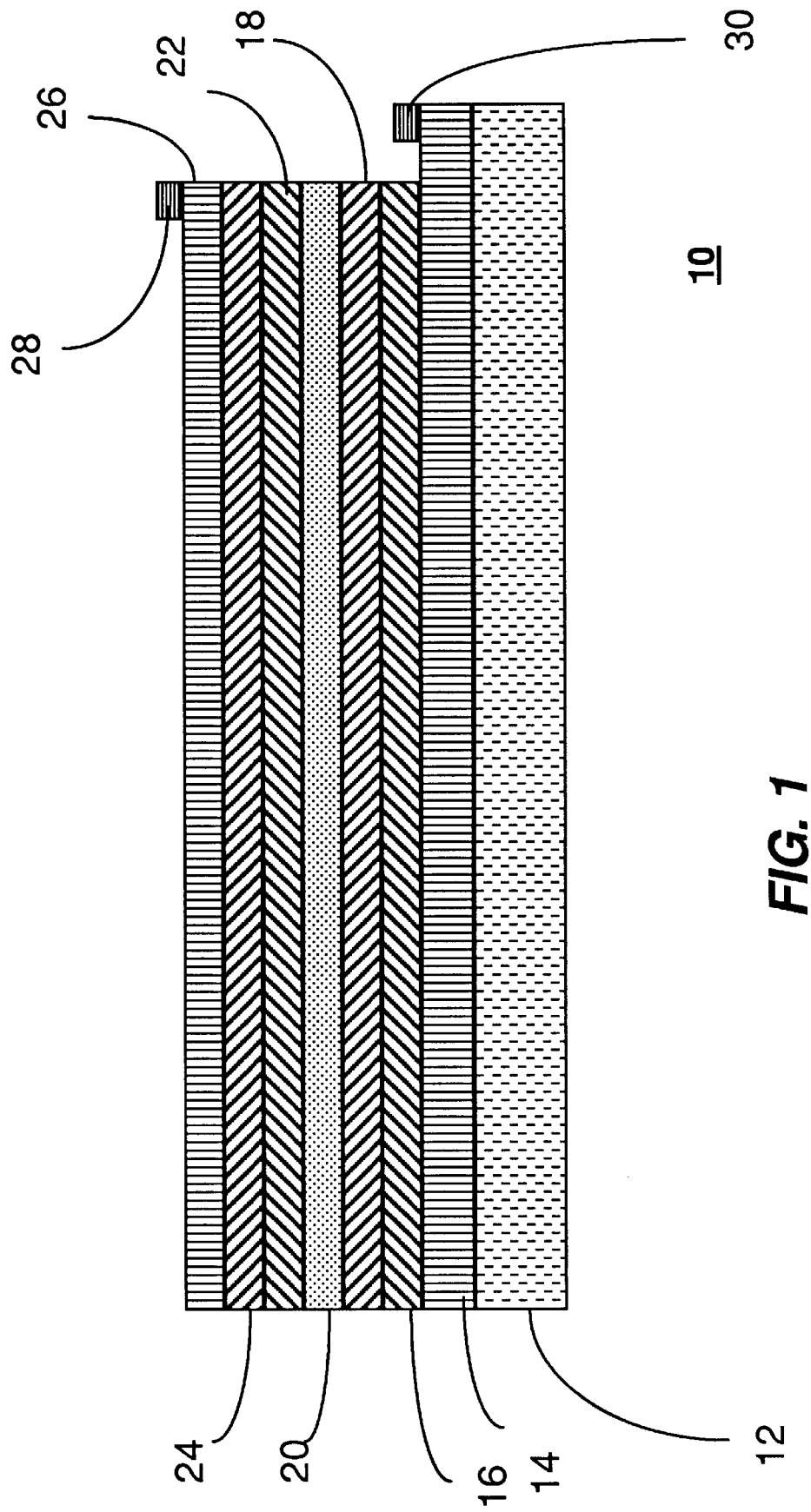
FIG. 1 is a cross-sectional side view of an organic electroluminescent device in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein an organic electroluminescent device as is well known in the art. The device 10 contains, as a rule, one or more layers of organic charge transport materials. The device 10 is fabricated upon a first substrate 12 which is transparent and may be fabricated of any of a number of known materials employed in the art. For example, the substrate 12 may be fabricated of a glass, such as a Corning 7059 glass, transparent plastic substrates made of polyolefins, polyethersulfones, and polyarylates. In one preferred embodiment, the substrate 12 is fabricated of glass of quality good for flat panel display applications.

Deposited atop substrate 12 is a first electrode 14, which is electrically conductive and optically transparent or semi-transparent. Several materials may be advantageously employed as the first electrode for an OED device. Examples of materials include conductive metal oxides such as indium oxide, indium-tin oxide (ITO), zinc oxide, zinc-tin oxide, conductive transparent polymers such as polyaniline. Alternatively, the electrode 14 may be fabricated of a semi-transparent metal, examples of which include a thin layer (<500 Å) of gold, copper, silver, and combinations thereof. In one preferred embodiment, the electrode 14 is fabricated of ITO or zinc oxide.

Thereafter, a first layer of an organic material 16 is deposited atop the first electrode 14. The first layer 16 is an organic material adapted to accept holes from the first electrode 14, the holes being for subsequent combination with electrons in the emitter layer described herein below. The layer 16 is known as the hole injecting layer and also acts as a buffer layer to match the thermal and mechanical properties of the first electrode and the subsequent layers of organic materials. The hole injecting layer is preferably comprised of a porphyrinic compound of the type disclosed by, for example, Adler in U.S. Pat. No. 3,935,031 or Tang in U.S. Pat. No. 4,356,429. Examples of the preferred compounds include copper phthalocyanine, or zinc phthalocyanine, to name a few.

Thereafter deposited atop the hole injecting layer 16 is a hole transporting layer 18. The purpose of the hole transporting layer is to facilitate the transport of holes from the hole injecting layer 16 to the emitter layer 20 where they are combined with the electrons to create photons for the emission of light. The hole transporting layer 18 will be described in greater detail herein below.

Thereafter deposited atop the hole transporting layer 18 is a layer of emitter material. The emitter layer 20 is typically comprised of a host emitting matrix and a guest emitter. The host emitting matrix is fabricated of an organic material adapted to accommodate both holes and electrons and then transfer the excited state energies to the guest emitter, wherein the holes and electrons combine and emit a photon of light causing a visible change in the appearance of the OED device to a viewer thereof. The materials that can be used as the host emitting matrix include metal chelated oxinoid compounds disclosed in, for example, U.S. Pat. Nos. 4,769,292 and 5,529,853, and organometallic complexes disclosed in commonly assigned, co-pending U.S. patent application Ser. No. 08/304,451, entitled "NEW ORGANO-METALLIC COMPLEXES FOR USE IN LIGHT EMITTING DEVICES", filed Sep. 12, 1994, the disclosure of which is incorporated herein by reference. Examples of the preferred host emitting matrix materials are selected from tris(8-quinolinol) aluminum, bis(10-oxo-benzo[h] quinoline beryllium, bis(2-(2-oxy-phenyl)benzoxazole) zinc, bis(2-(2-oxyphenyl)benzothiazole) zinc. The materials that can be used as a guest emitter include dyes and pigments of high fluorescent efficiency. For efficient energy transfer, it is necessary that the guest emitter material has a bandgap no greater than that of the material making up the emitting host matrix. It is preferred that the guest emitter material is present in a concentration of from $10^{-3}$ to 10 mole percent, based on the moles of the material comprised of the emitting host matrix. The selection of the guest emitting materials is well known to those skilled in the art.

Thereafter deposited atop the emitter layer 20 is an electron transporting layer 22 fabricated of a material such as that disclosed in U.S. Pat. No. 4,769,292 and U.S. Pat. No. 5,529,853. Alternatively, and in a preferred embodiment, the material may be that disclosed in the aforementioned commonly assigned, co-pending U.S. patent application Ser. No. 08/304,451. The electron transporting layer, like the hole transporting layer 18, is adapted to gather charge carriers, in this case electrons, generated in an electron injecting layer for transport to the emitter layer where they are combined with holes as described hereinabove. In this regard, materials appropriate for the electron transporting layer include tris(8-quinolinol) aluminum, bis (10-oxo-benzo[h] quinoline beryllium, bis(2(2-oxy-phenyl) benzoxazole) zinc, bis(2-(2-oxy-phenyl)benzothiazole) zinc, and combinations thereof.

Thereafter deposited atop the electron transporting layer is an electron injecting layer 24. The electron injecting layer 24 like the hole injecting layer 14 is adapted to accept charge carriers, in this case electrons. In general, the electron injection layer 24 may be omitted without significant compromise of the device performance.

Deposited atop the electron injecting layer is a second electrode 26 which is typically formed of a metal of work function of less than about 4 electron volts (eV) and at least one other protective metal of higher work function. The preferred low work function metal is selected from a group of lithium, magnesium, calcium, strontium, and combinations thereof, while the preferred high work function metal is selected from a group of aluminum, indium, copper, gold, silver, combinations thereof. Alternatively, the second electrode is formed of an alloy of a lower work function metal and a high work function metal by co-evaporation. The content of the low work function metal in the second electrode can vary from 0.1% to 50%, but preferably below 20%.

In operation, holes inject from the first electrode (also called anode) and electrons inject from the second electrode (also called cathode) into the organic layers disposed between the electrically conductive electrodes 14 and 26, when an electrical current is applied between the anode and cathode. An electrical current may be applied by connecting the electrodes to electrical current generation means (not shown) at electrical contacts 28 and 30 on electrodes 26 and 14 respectively. Electrical contacts may be fabricated of any type of electrically conductive material which is mechanically compatible with the electrode materials.

The instant invention is directed to a novel hole transporting system which may be used in the hole transporting layer 18 of the instant invention. The hole transporting system is actually a multi-component compound consisting of a hole transporting material and a polymeric network selected to stabilize the hole transporting material, particularly at elevated temperatures.

A preferred hole transporting material for use in the hole transporting system is typically characterized by a glass transition temperature of more than 75° C. and preferably more than about 90° C. The hole transporting material itself may be selected from the group of materials consisting of:

(Formula I)

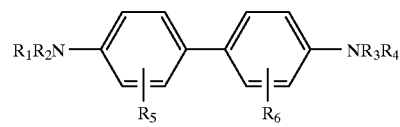

-continued

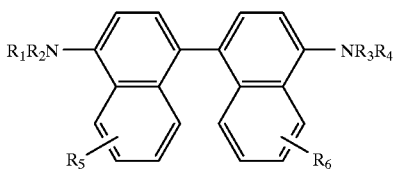
(Formula II)

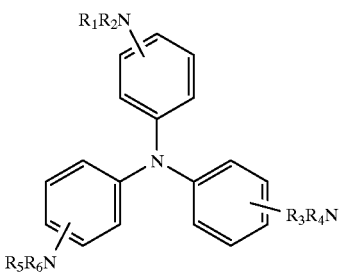
(Formula III)

wherein $R_1$ and $R_2$, $R_3$, $R_4$, $R_5$, and $R_6$ each independently represent a hydrogen atom, an alkyl group of 1–6 carbons, a halogen group, a cyano group, a nitro group, a aryl group of 6–15 carbons, a fused aromatic group, an alkylamine group, an aryloxy group, and arylamine group, and combinations thereof. In one preferred embodiment, the hole transporting material is specifically selected from the group consisting of 4,4'-bis(N-(1naphthyl)-N-phenyl amino)-biphenyl, 4,4'-bis(N-(1-naphthyl)-N-phenyl amino)-binaphthyl, 1,3,5-tris(N(1-naphthyl)-N-phenyl amino) benzene, and combinations thereof.

The hole transporting system, in addition to the hole transporting material includes a polymeric network for stabilizing the hole transporting material. The polymeric network confines the organic hole transporting material in numerous domains of submicron to micron size, thus prevent any sizable aggregation or recrystallization of the organic hole transporting material, which is the main cause of thermal failure of OED's.

The polymeric network is typically made from a thermal or photosensitive precursor. The precursor is selected from the group of materials consisting of thermal or photosensitive vinyl compounds, epoxides, polyimides or polysiloxanes. Examples of the precursor include poly(glycidyl methacrylate), poly(allyl methacrylate-co-2-hydroxyethyl methacrylate), poly(chloromethylstyrene), Probimide™300 (from Ciba-Geigy Corporation). Alternatively the precursor can also be thermal or photosensitive oligomers or monomers of film-formation ability. Bisphenol A type of resins belong to this class.

In practice, the hole transporting layer is deposited on top of the first electrode by spin coating a mixture of a hole transporting material and a precursor in an organic solvent, in which both the hole transporting material and the precursor are soluble. The resulting uniform film is then subjected to either thermal or radiation treatment, depending on the type of precursor used, to form a robustic polymeric network. In this embodiment, the polymeric network comprises between 1 and 40 wt % of the hole transporting system. Accordingly, the hole transporting material comprises between 60 and 99 wt % of the hole transporting system. More preferably, the polymeric material comprises between three and 10 wt % of the hole transporting system. Therefore, the hole transporting properties are dominated by the organic hole transporting material confined in the polymeric network. The OED devices with polymer stabilized hole transporting materials generally operate below 20 V, with good thermal stability up to 100° C.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A stabilized hole transporting system in an electroluminescent display device, comprising: a hole transporting material characterized by a glass transition temperature of more than about 75° C. and a polymeric network, wherein said polymeric network is made from a thermal or photosensitive precursor selected from the group of materials consisting of vinyl compounds, epoxides, polyimides or polysiloxanes, and the stabilized hole transporting system includes the precursor mixed with the hole transporting material and polymerized into the polymeric network.

2. A stabilized hole transporting system as in claim 1, wherein said hole transporting material is selected from the group of materials consisting of

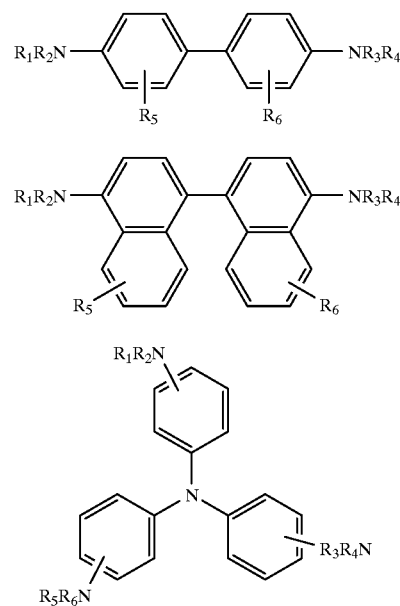

wherein $R_1$ and $R_2$, $R_3$, $R_4$, $R_5$, and $R_6$ each independently represent a hydrogen atom, an alkyl group of 1–6 carbons, a halogen group, a cyano group, a nitro group, an aryl group of 6–15 carbons, a fused aromatic group, an alkylamine group, an aryloxy group, an arylamine group and combinations thereof.

3. A stabilized hole transporting system as in claim 1, wherein sail hole transporting material is selected from the group of materials consisting of 4,4'-bis(N-(1-naphthyl)-N-phenylamino)-biphenyl, 4,4'-bis(N-(1-naphthyl)-N-phenylamino)-binaphthyl, 1,3,5-tris(N(1-naphthyl)-N-phenyl amino)benzene, and combinations thereof.

4. A stabilized hole transporting system as in claim 1, wherein said polymeric network is selected from the group of poly(glycidyl methacrylate), poly(allyl methacrylate-co-2-hydroxyethyl methacrylate), poly(chloromethylstyrene), Probimide™300, bisphenol-A type of resins, and combinations thereof.

5. A stabilized hole transporting system as in claim 1, wherein the polymeric network comprises between 1 and 40 wt % of the hole transporting system.

6. A stabilized hole transporting system as in claim 1, wherein the polymeric network comprises between 3 and 10 wt % of the hole transporting compound.

7. An organic electroluminescent display device comprising a plurality of layers of organic molecules disposed between a pair of electrodes, at least one of said layers of organic molecules comprising a hole transporting system including a hole transporting material characterized by a glass transition temperature of more than about 75° C. and a polymeric network, wherein said polymeric network is made from a thermal or photosensitive precursor selected from the group of materials consisting of vinyl compounds, epoxides, polyimides or polysiloxanes, mixed with the hole transporting material and polymerized.

8. An organic electroluminescent display device as in claim 7, wherein said hole transporting material is selected from the group of materials consisting of

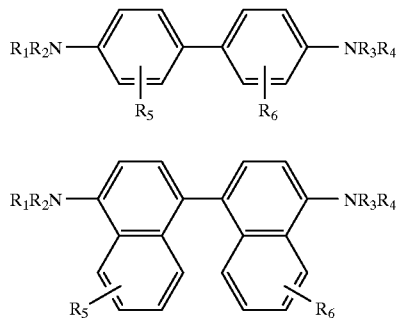

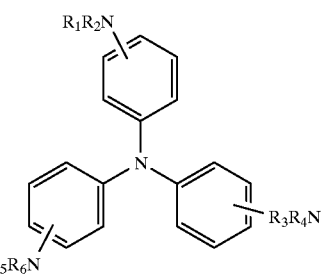

wherein $R_1$ and $R_2$, $R_3$, $R_4$, $R_5$, and $R_6$ each independently represent a hydrogen atom, an alkyl group of 1–6 carbons, a halogen group, a cyano group, a nitro group, an aryl group of 6–15 carbons, a fused aromatic group, an alkylamine group, an aryloxy group, an arylamine group and combinations thereof.

9. An organic electroluminescent display device as in claim 7, wherein said hole transporting material is selected from the group of materials consisting of 4,4'-bis(N-(1-naphthyl)-N-phenylamino)-biphenyl, 4,4'-bis(N-(1-naphthyl)-N-phenylamnio)-binaphthyl, 1,3,5-tris(N(1-naphthyl)-N-phenyl amino)benzene, and combinations thereof.

10. An organic electroluminescent display device as in claim 7, wherein said polymeric network is selected is selected from the group of poly(glycidyl methacrylate), poly(allyl methacrylate-co-2-hydroxyethyl methacrylate), poly(chloromethylstyrene), Probimide™300, bisphenol-A type of resins, and combinations thereof.

11. An organic electroluminescent display device as in claim 7, wherein the polymeric network comprises between 1 and 40 wt % of the hole transporting system.

12. An organic electroluminescent display device as in claim 7, wherein the polymeric material comprises between 3 and 10 wt % of the hole transporting system.

* * * * *

UNITED STATES PATENT AND TRADEMARK OFFICE
CERTIFICATE OF CORRECTION

PATENT NO. : 5,985,417  
DATED : November 16, 1999  
INVENTOR(S) : Song Shi et al.

Page 1 of 1

It is certified that error appears in the above-identified patent and that said Letters Patent is hereby corrected as shown below:

<u>Column 6, claim 3,</u>  
Line 57, delete "sail" and replace with -- said --.

Signed and Sealed this

Sixteenth Day of April, 2002

*Attest:*

JAMES E. ROGAN  
*Attesting Officer*     *Director of the United States Patent and Trademark Office*